US011373566B2

(12) United States Patent
Kao et al.

(10) Patent No.: US 11,373,566 B2
(45) Date of Patent: Jun. 28, 2022

(54) ELECTRONIC DEVICE AND MANUFACTURING PROCESS THEREOF (71) Applicant: InnoLux Corporation, Miao-Li County (TW)

(72) Inventors: Ker-Yih Kao, Miao-Li County (TW); Chin-Lung Ting, Miao-Li County (TW); Liang-Lu Chen, Miao-Li County (TW)

(73) Assignee: INNOLUX CORPORATION, Miao-Li County (TW)

(*) Notice: Subject to any disclaimer, the term of this patent is extended or adjusted under 35 U.S.C. 154(b) by 0 days.

(21) Appl. No.: 16/683,850

(22) Filed: Nov. 14, 2019

(65) Prior Publication Data
US 2020/0193883 A1 Jun. 18, 2020

Related U.S. Application Data (60) Provisional application No. 62/781,118, filed on Dec. 18, 2018.

(30) Foreign Application Priority Data

Aug. 26, 2019 (CN) .......................... 201910790037.1

(51) Int. Cl.
G09G 3/00 (2006.01)
H01L 21/66 (2006.01)
H01L 27/12 (2006.01)

(52) U.S. Cl.
CPC ............. *G09G 3/006* (2013.01); *H01L 22/14* (2013.01); *H01L 27/124* (2013.01); *H01L 27/1259* (2013.01)

(58) Field of Classification Search
CPC .... G09G 3/006; G09G 3/3208; G09G 3/3233; H01L 22/14; H01L 27/124; H01L 27/1259
See application file for complete search history.

(56) References Cited

U.S. PATENT DOCUMENTS 8,217,928 B2 * 7/2012 Levey ................. G09G 3/3233
345/211
2004/0189559 A1 * 9/2004 Shih ..................... G09G 3/3233
345/84
2018/0012814 A1 * 1/2018 Zhan ................. G01R 31/2644

OTHER PUBLICATIONS

Extended European Search Report dated May 18, 2020, issued in application No. EP 19213354.4.

* cited by examiner

*Primary Examiner* — David D Davis
(74) *Attorney, Agent, or Firm* — McClure, Qualey & Rodack, LLP (57) ABSTRACT An electronic device includes a first sub-pixel and a test element. The first sub-pixel includes a first transistor, and a first electronic unit. The first electronic unit is electrically connected to the first transistor. The test element is electrically connected to the first transistor. The test element has a first impedance, the first electronic unit has a second impedance, and the first impedance is higher than the second impedance.

10 Claims, 7 Drawing Sheets

ELECTRONIC DEVICE AND MANUFACTURING PROCESS THEREOF

CROSS REFERENCE TO RELATED APPLICATIONS

This Application claims priority of China Patent Application No. 201910790037.1, filed on Aug. 26, 2019, and provisional 62/781,118, filed on Dec. 18, 2018, of United States, the entirety of which is incorporated by reference herein.

FIELD OF THE PRESENT DISCLOSURE

The present disclosure relates to an electronic device and the manufacturing process thereof, and in particular it relates to an electronic device and the manufacturing process of an active matrix light-emitting diode.

DESCRIPTION OF THE RELATED ART

Active matrix drivers on the existing commercial market have a corresponding thin film transistor (TFT) on each pixel to drive the light-emitting elements of each pixel. This is how they can produce high-brightness images, high-definition images, or images with a wide viewing angle. However, in the existing manufacturing process for active matrix light-emitting diodes, there is currently no way to test whether the function of the corresponding thin film transistor in each pixel is normal or not before the surface mount technology (SMT) process of the LED is performed. Rather, it is necessary to perform a light-on inspection of each pixel after the SMT process is performed on the LED. Therefore, if the thin film transistor corresponding to the pixel is found to be defective in the light-on process after the LED is mounted, the LED is wasted. This increases the cost and time required for processing.

BRIEF SUMMARY OF THE PRESENT DISCLOSURE

In order to resolve the problem described above, the present disclosure discloses an electronic device, comprising a first sub-pixel and a test element. The first sub-pixel comprises a first transistor, and a first electronic unit. The first electronic unit is electrically connected to the first transistor. The test element is electrically connected to the first transistor. The test element has a first impedance, the first electronic unit has a second impedance, and the first impedance is higher than the second impedance.

The present disclosure discloses a manufacturing process of an electronic device, comprising: disposing a first transistor and a test element on a substrate, wherein the first transistor is electrically connected to the test element; turning off the first transistor; providing a voltage between the first transistor and the test element; performing a determination step through the test element and obtaining a determination result; and determining whether to set a first electronic unit on the substrate according to the determination result.

DETAILED DESCRIPTION OF THE PRESENT DISCLOSURE

The disclosure can be understood by referring to the following detailed description and the accompanying drawings. It is noticed that in order to let readers easy to understand and for the simplicity of drawings, the multiple drawings in the disclosure only depict a part of an electronic device, and the specific components in the drawings is not drawn in scale. In addition, the number and size of various components in the figures are for illustrative purposes only, and are not intended to limit the scope of the disclosure.

The whole specification and the appended claims may use certain terms to refer to particular elements. Persons skilled in the art will understand that electronic device manufacturers may refer to the same element under different names. The disclosure is not intended to distinguish between elements that have the same function but have different names. In the following description and claims, the words "having" and "comprising" are interpreted as "comprising but not limited to".

The terms "about", "equal to", "same" or "identical" generally mean within 20% of a given value or range, or mean within 10%, 5%, 3%, 2%, 1% or 0.5% of the given value or range.

In the disclosure, the same or similar elements are designated by the same or similar numerals, and the description thereof is omitted. In addition, the features of the different embodiments may be arbitrarily mixed and used without departing from the spirit of the disclosure, and the simple equivalent changes and modifications made from the specification or the claims are still within the scope of the disclosure. In addition, the terms "first", "second" and the like mentioned in the specification or the claims are used to identify discrete elements or to distinguish different embodiments or ranges, and are not intended to limit the upper or lower limits of the number of elements, and are not intended to limit the manufacturing order or the disposing order of the elements.

An electronic device of the present disclosure may include, a display device, an antenna device, a sensing device, a light-emitting device, or a splicing device, but it is not limited thereto.

Figure 1:
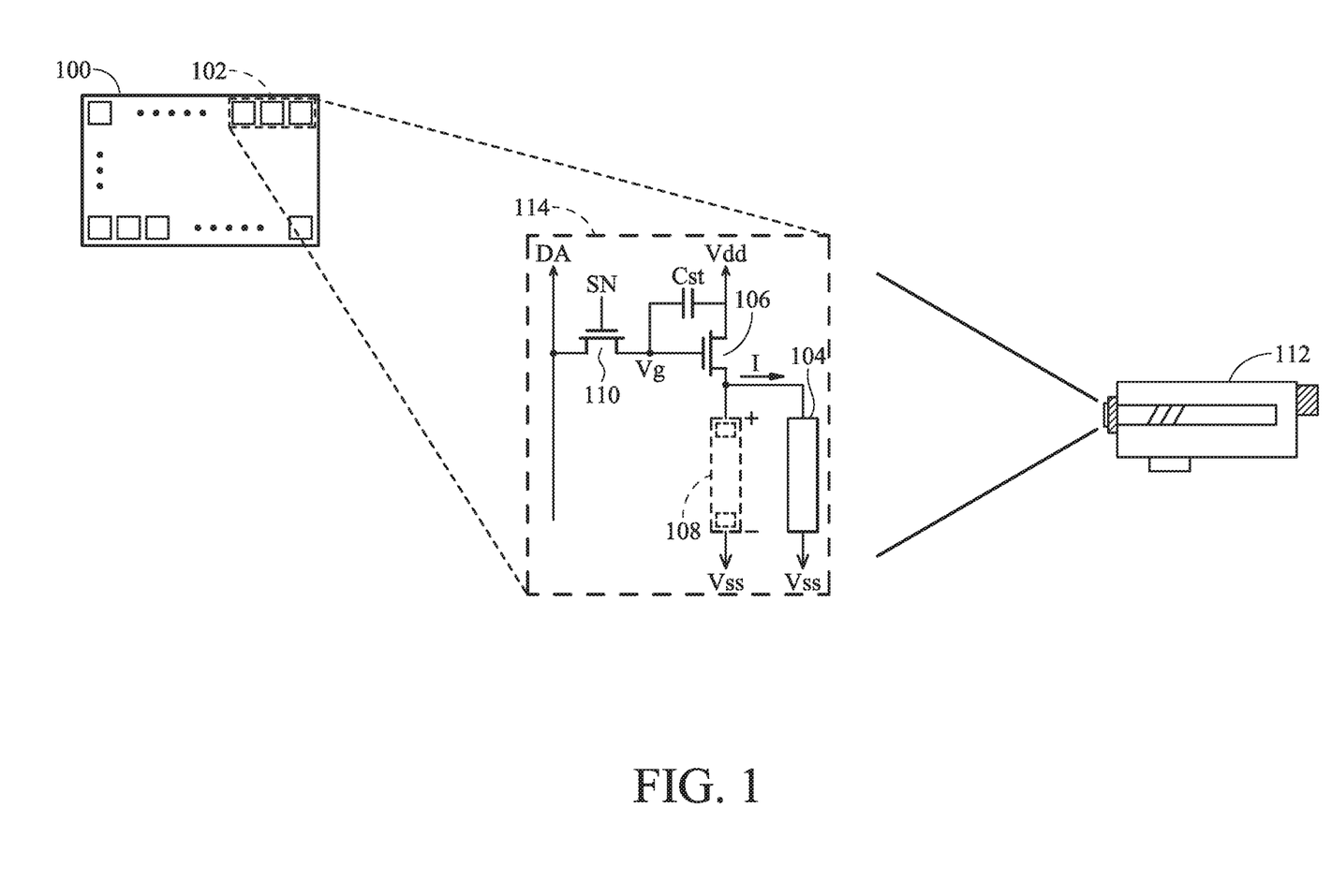
FIG. 1 is a schematic diagram of an electronic device in accordance with some embodiments of the disclosure.

FIG. 1 is a schematic diagram of an electronic device 100 in accordance with some embodiments of the disclosure. The content of the disclosure will be described below with the electronic device 100, but the disclosure is not limited thereto.

A display area of the electronic device 100 includes a plurality of pixels (e.g. a pixel 102), wherein one pixel (e.g. the pixel 102) at least includes a sub-pixel (e.g. a sub-pixel 114). In some embodiments (as shown in FIG. 1), the electronic device 100 is an active matrix driving LED display device. The sub-pixel 114 is formed by two adjacent scan lines SN and two adjacent data lines DA (not shown) interlacing each other, but they are not limited thereto. In some embodiments, the electronic device 100 may be, for example, a bendable or flexible electronic device, but it is not limited thereto.

In some embodiments (as shown in FIG. 1), the sub-pixel 114 includes, for example, a transistor 106 (e.g. a driving transistor), a transistor 110 (e.g. a switching transistor), an electronic unit 108, and/or a capacitor Cst. In some embodiments, the capacitor Cst, for example, is connected between a gate and a source of the transistor 106 to maintain a voltage (Vgs) across the gate and the source of the transistor 106, but it is not limited thereto. It is noticed that the sub-pixel 104 may increase other transistors (e.g. reset transistors, but it is not limited thereto), other capacitors, or other suitable elements according to requirements. In addition, the number or the (electrical) connection relationship of the above-mentioned transistors, the capacitor, and the electronic unit is not limited to the illustration of the present disclosure, and may be appropriately adjusted according to requirements.

The material of the above-mentioned transistor may include amorphous silicon, polysilicon (such as low-temp polysilicon, LTPS), oxide semiconductor (such as indium gallium zinc oxide, IGZO), other suitable materials or combinations thereof, but the disclosure is not limited thereto. In some embodiments, the electronic device 100 may include transistors of different materials as described above. For example, some of the transistors may include low temperature polysilicon materials, and some of the transistors may include indium gallium oxide, but they are not limited thereto.

The transistor in embodiments of the present disclosure may select a top-gate thin film transistor, a bottom-gate thin film transistor, dual-gate thin film transistor or a dual-gate thin film transistor according to requirements, but it is not limited thereto.

In some embodiments, the electronic unit 108 includes an inorganic light-emitting diode (LED), such as a micro LED, mini LED, Quantum Dot LED (QD-LED or QLED), or other suitable LED, but it is not limited thereto. In some embodiments, a light conversion material (not shown) may be disposed on the electronic unit 108, and the light conversion material includes, for example, a quantum dot (QD) material, a fluorescence material, a color filter (CF) material, a phosphor material, other suitable light converting material, or the combination thereof, but it is not limited thereto.

In some embodiments (as shown in FIG. 1), the electronic device 100 includes at least one test element 104 electrically connected to a transistor 106 (e.g. a driving transistor). In some embodiments (as shown in FIG. 1), the test element 104 is disposed, for example, adjacent to the transistor 106. In some embodiments (as shown in FIG. 1), the test element 104, for example, at least partially overlaps the sub-pixel 114 in a top view of the electronic device 100. In some embodiments, the test element 104 spans, for example, between two adjacent sub-pixels 114, or the test element 104 at least partially overlaps, for example, two adjacent sub-pixels 114 in a top view of the electronic device 100. In some embodiments, one end of the test element 104, for example, is electrically connected to the transistor to be tested, and the other end of the test element 104 is electrically connected to a voltage, for example, a negative voltage (e.g. Vss in FIG. 1), a ground voltage (GND), or a positive voltage (not shown, the positive voltage is, for example, less than a positive voltage Vdd of FIG. 1). In some embodiments (as shown in FIG. 1), the electronic unit 108, for example, is connected in parallel to the test element 104, but it is not limited thereto.

In some embodiments, an impedance of the test element 104 is greater than an impedance of the electronic unit 108.

In some embodiments, before the electronic unit 108 is disposed on a substrate (no shown) of the electronic device 100, the test element 104 can be used, for example, to test and determine whether the circuit is defective or not. For example, the test element 104 can be used to test whether the transistor (e.g. the transistor 106 and/or the transistor 110) is defective. For example, before the electronic unit 108 is disposed on the substrate (not shown) of the electronic device 100, the path connecting the electronic unit 108 as shown in FIG. 1 is, for example, open. At this time, the transistor 106 is operated to be turned off and a determination step is performed on the transistor 106. The determination step is determined, for example, by a temperature detector 112. The method of the detailed determination step will be described in detail later. When the transistor 106 is defective, during the test or the determination process, the transistor 106 may not be able to be normally turned off (that is, there is a short circuit in the transistor 106) according to the above-described execution requirements. In detail, the defective transistor 106 as described above can be regarded as, for example, a resistor. When a voltage difference (the voltage difference=a positive voltage Vdd—a negative voltage Vss (or a ground voltage)) is provided between the defective transistor 106 and the test element 104, a leakage current I may be generated because the transistor 106 cannot be normally turned off. The leakage current I may flow through the test element 104 to generate thermal energy.

In some embodiments, the impedance of the test element 104 may be increased as needed, or the voltage difference between the positive voltage Vdd and the negative voltage Vss (or the ground voltage or a positive voltage less than the positive voltage Vdd) may be increased. When the transistor 106 is defective, the thermal energy generated by the test element 104 may be increased, and it is easier to determine whether the transistor (e.g. the transistor 106) is defective or not. The defects of the transistor may be, for example, a short circuit of the transistor caused by a metal material or a conductive material which is not properly left in the lamination of the transistor, or other possible causes for the transistor fail to turn off normally, resulting in a defect, but it is not limited thereto. In addition, if the transistor 106 has no defects, the transistor 106 is turned off normally, so that no leakage current I flows through the transistor 106 to the test element 104, at which time the test element 104 does not generate abnormal thermal energy. Regarding the definition of the abnormal thermal energy, for example, assuming that the temperature T of the test element 104 before the test is 25 degrees Celsius, according to the test experience in the past. As long as the temperature of the test element 104 exceeds T+ΔT during the test, for example, ΔT is 10 degrees Celsius, that is, when the temperature of the test element 104 exceeds 35 degrees Celsius, it is determined that the test element 104 may generate abnormal thermal energy, so that the transistor 106 is presumed to be defective, for example. If the temperature of the test element 104 is lower than T+ΔT during the test, it is determined that the test element 104 does not generate abnormal thermal energy, so that the transistor 106 is presumed to be free from defects, but it is not limited thereto. It should be noted that the above ΔT value is only an example, and the ΔT value may be different due to different materials, thickness, laminated structures of accessories (such as a heat sink, an outer frame member, and a substrate, and is not limited thereto) included in different electronic devices. The size (or resolution) of the electronic device, process variation etc. may also affect the ΔT value, so the evaluation criteria of the ΔT value, for example, need to consider the above possible causes.

In some embodiments of the present disclosure, when the test transistor 106 has no defects, the electronic unit 108 can be subsequently disposed on the substrate (an array substrate or a circuit board) and be electrically connected to the transistor 106. In some embodiments (as shown in FIG. 1), since the test element 104 is connected in parallel to the electronic unit 108, in order to reduce the influence of the test element 104 on the operation of the electronic unit 108, the impedance of the test element 104 can be designed to be greater than the impedance of the electronic unit 108. The ratio between the impedance of the test element 104 and the impedance of the electronic unit 108 can be between 10 and $10^7$ ($10 \leq ratio \leq 10^7$), but it is not limited thereto. For example, in the case where the electronic unit 108 (e.g. a light-emitting diode) is turned on during operation (such as the light-emitting diode emits light), the design of the impedance ratio can reduce the on current of the electronic unit 108 to be shunted into the test element 104 for reducing the influence on the operation of the electronic unit 108. In some embodiments, the impedance of the electronic unit 108 when turned on is 5 kohms (k Ω), and the impedance of the test element 104 may be between 50 kohms (k Ω) and 500 Gohms(G Ω) (50 k Ω≤impedance≤500 G Ω), but it is not limited thereto. The above impedance is measured, for example, by a multimeter or other suitable instruments. In some embodiments, when the electronic unit 108 is not disposed, the impedance of the test element 104 can be measured by a impedance measuring instrument (for example, the multimeter), and the probes of the impedance measuring instrument, for example, can be electrically connected to two ends of the test element 104, but they are not limited thereto. Alternatively, the traces electrically connected to the two ends of the test element 104 are respectively soldered with two different conductive wires, and the probes of the impedance measuring instrument, for example, can be electrically connected to the two different conductive wires, but it is not limited thereto.

In addition, according to the relationship $T \propto P = I^2 R$, the temperature T can correspond to the temperature of the test element 104, the power P can correspond to the power consumed by the test element 104, and the leakage current I can correspond to the leakage current flowing to the test element 104. The impedance R can correspond to the impedance of the test element 104. In other words, when the leakage current I flowing to the test element 104 increased, the power P increases, or the temperature T increases (that is, the thermal energy generated by the test element 104 increased. In addition, the present disclosure can utilize a temperature detector 112 in FIG. 1 to detect the temperature generated by the test component 104 to determine whether a circuit (e.g. a transistor) of the sub-pixel 114 is defective or not. In addition, according to a position where the heat source detected by the temperature detector 112 is located, the tester can more easily screen out the transistor 106 corresponding to the position, or may analyze the transistor 106 according to requirements.

In addition, when the transistor 106 is defective, the voltage difference between the positive voltage Vdd and the negative voltage Vss can be increased to increase the leakage current I flowing to the test element 104, and the thermal energy generated by the test element 104 is increased (that is, the temperature of the test element 104 is increased),the temperature detector 112 is more likely to detect the location of the heat source, but it is not limited thereto. It should be noted that during the process of increasing the voltage difference between the positive voltage Vdd and the negative voltage Vss (or the ground voltage), for example, the transistor 106 is still controlled to be turned off. In addition, during the process of increasing the voltage difference between the positive voltage Vdd and the negative voltage Vss (or the ground voltage), for example, the value of the positive voltage Vdd is controlled to be lower than the value of the rated voltage of the transistor 106 to reduce damage to the transistor 106 (e.g. burn the transistor 106).

Figure 2:
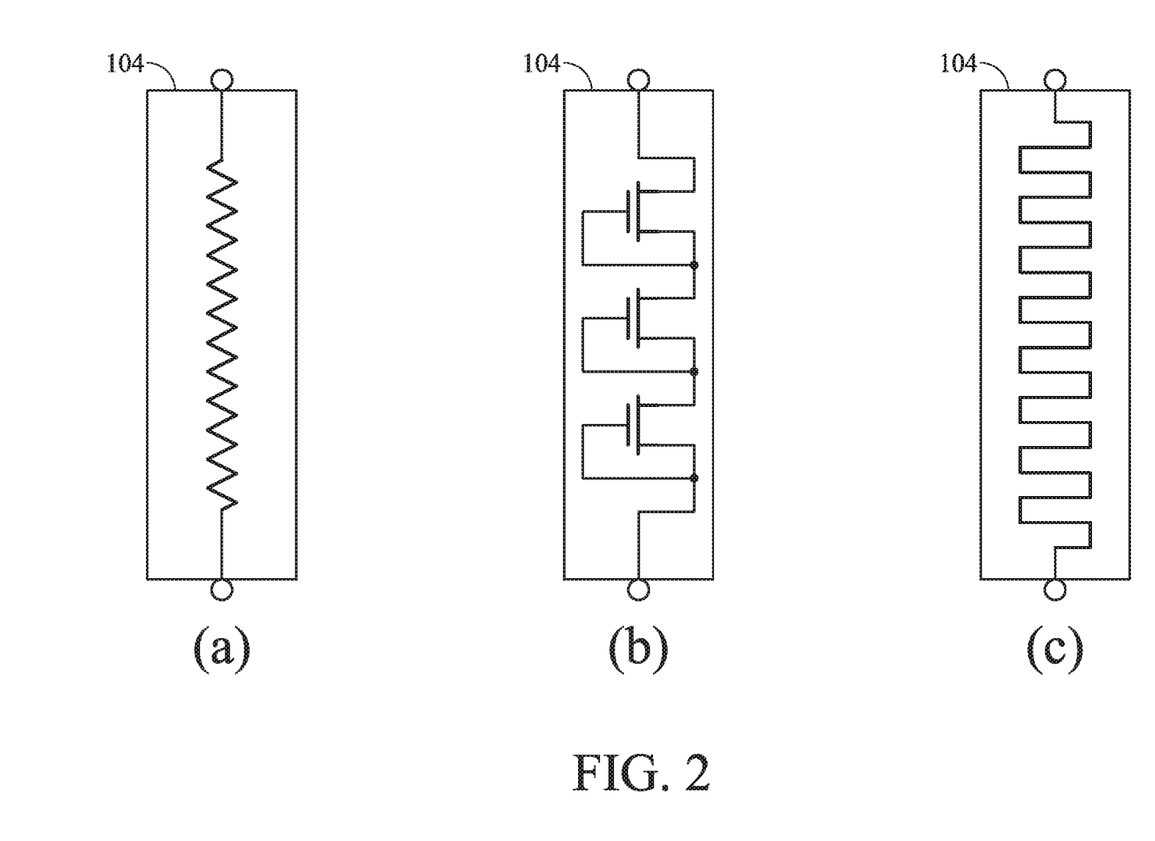
FIG. 2 is a schematic diagram of a test element in accordance with some embodiments of the disclosure.

FIG. 2 is a schematic diagram of a test element 104 in accordance with some embodiments of the disclosure. FIG. 2 includes FIG. 2(a), FIG. 2(b) and FIG. 2(c). In some embodiments, as shown in FIG. 2(a), the test element 104 may include a resistor, and the test element 104 can be disposed on a substrate, for example, by surface mount technology (SMT), but it is not limited thereto. In some embodiments, as shown in FIG. 2(b), the test element 104 may include a pseudo thin film transistor (TFT), and the test element 104 can be disposed on a substrate (not shown), for example, or the test element 104 can be formed in the same process as the transistor 106 and/or the transistor 110, but it is not limited thereto. The number of pseudo TFT (for example, three) in FIG. 2(b) is merely an example, but it is not limited thereto, and the number of pseudo TFT can be adjusted as needed. In some embodiments, as shown in FIG. 2(c), the test element 104 may include a high-impedance trace line, and the test element 104 can be disposed, for example, on a substrate (not shown). In some embodiments, the high-impedance trace line can be selected, for example, by using high-impedance semiconductor materials such as different dopants of Si, GaAs, IGZO, transparent conductive materials with high oxygen content conditions (for example, ITO), poly-Si, or other suitable materials or combinations thereof, but they are not limited thereto. In some embodiments, according to a formula impedance R=[length (L)/cross-sectional area (A)]*resistivity (ρ), the high-impedance trace line can be formed, for example, by adjusting the length (L) of the trace line, the cross-sectional area (A) of the trace line, or the resistivity (ρ) by the above formula, but it is not limited thereto.

Figure 3:
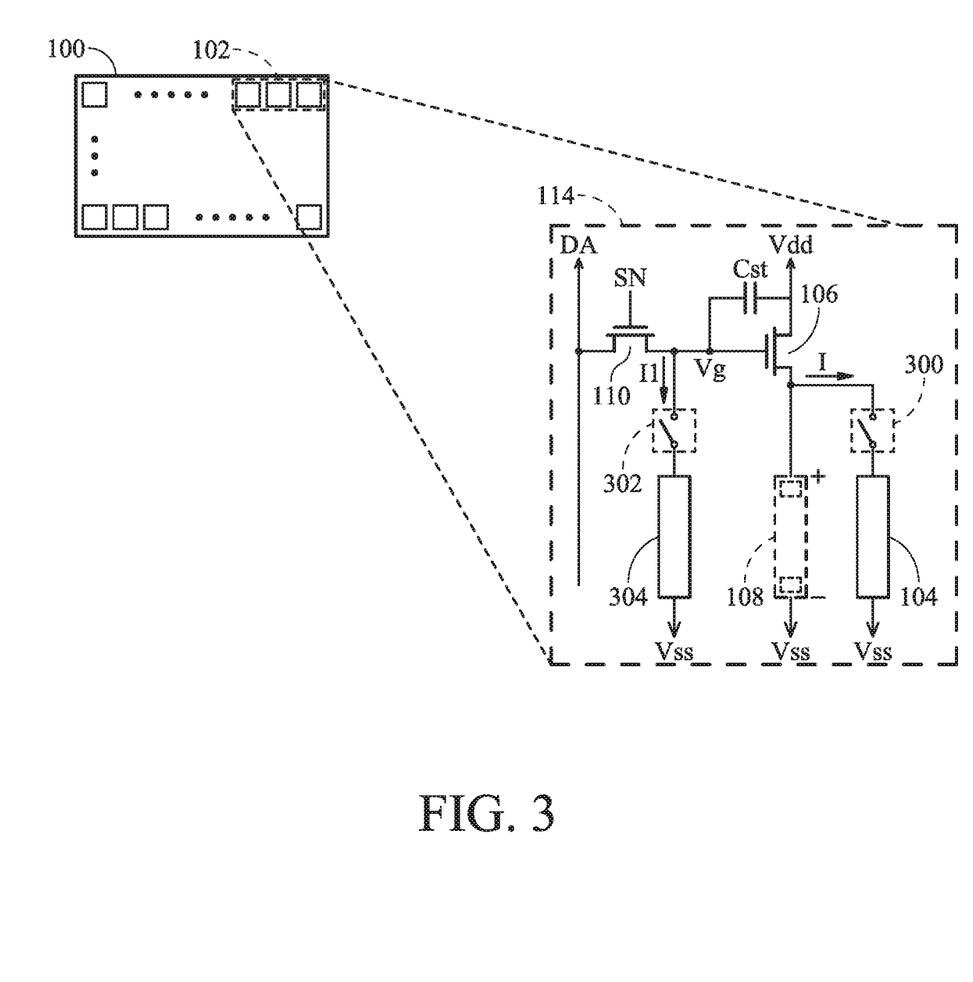
FIG. 3 is a schematic diagram of the electronic device in accordance with some embodiments of the disclosure.

FIG. 3 is a schematic diagram of the electronic device 100 in accordance with some embodiments of the disclosure. A control switch 300 can be further disposed between the test element 104 and the transistor 106 in FIG. 3 for controlling the electrical connection between the test element 104 and the transistor 106. In some embodiments, the control switch 300 can include a transistor or other suitable switch elements. In addition, the electronic device 100 in FIG. 3 further includes a test element 304 and a control switch 302, and the control switch 302 is disposed between the test element 304 and a transistor 110 for controlling the electrical connection between the test element 304 and the transistor 110. The other end of the test element 304 is electrically connected, for example, to the negative voltage Vss (or the ground voltage or a positive voltage lower than the positive voltage Vdd), but it is not limited thereto.

In some embodiments (as shown in FIG. 3), when the transistor 110 is to be tested for defects, the control switch 302 can be turned on to electrically connect the transistor 110 to the test element 304. Similarly, in the process of testing whether the transistor 110 is defective, for example, the transistor 110 is operated as turned off, and if the transistor 110 is defective, the transistor 110 may be short-circuited due to failure of turning off properly, the defective transistor 110 can be regarded as a resistor. Therefore, the leakage current I1 flows to the test element 304 to generate thermal energy. Similarly, after the test is completed to confirm that the transistor 110 has no defects, the transistor 106 can be further tested for defects. At this time, for example, the control switch 302 is first turned off to electrically insulate the transistor 110 from the test element 304, and then the control switch 300 is turned on, so that the transistor 106 is electrically connected to the test element 104, and the test method for testing whether the transistor 106 is defective is similar to the aforementioned test method, and will not be described here.

It should be noted that the test order of the transistor 110 and the transistor 106 is not limited to the aforementioned test method, and adjustment may be performed as needed.

In some embodiments, the test element 304 and the test element 104 can be the same element or different elements. In some embodiments, the impedance of test element 304 and the impedance of test element 104 can be the same or different.

Figure 4:
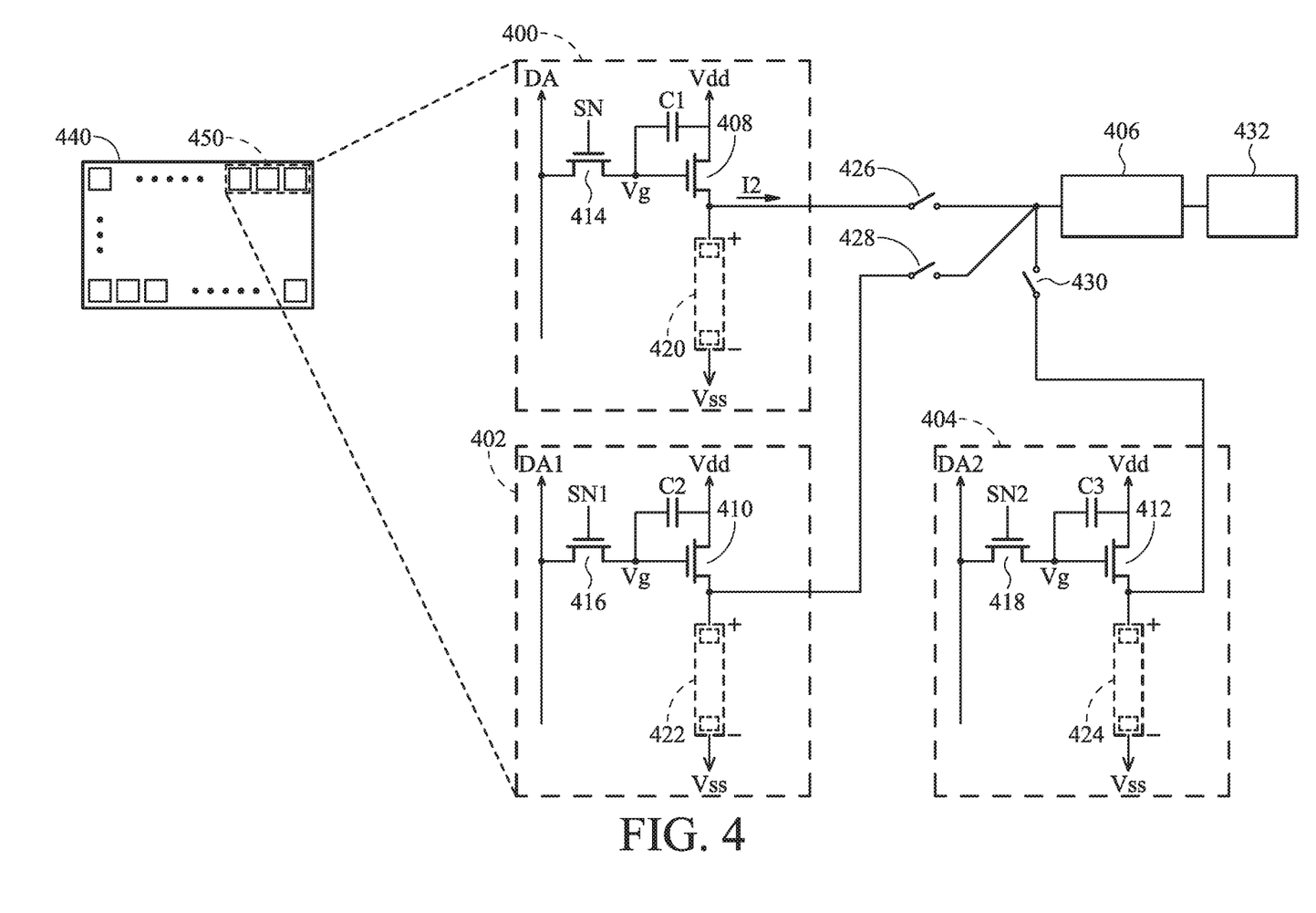
FIG. 4 is a schematic diagram of the electronic device in accordance with some embodiments of the disclosure.

FIG. 4 is a schematic diagram of the electronic device in accordance with some embodiments of the disclosure. As shown in FIG. 4, the display area of the electronic device 440 includes a plurality of pixels, wherein one pixel 450 may include a sub-pixel 400, a sub-pixel 402, and a sub-pixel 404. In some embodiments, the number of sub-pixels in a pixel can be adjusted as needed. The sub-pixel 400 may include a transistor 408, an electronic unit 420, a transistor 414, and a capacitor C1. The sub-pixel 402 may include a transistor 410, an electronic unit 422, a transistor 416, and a capacitor C2. The sub-pixel 404 may include a transistor 412, an electronic unit 424, a transistor 418, and a capacitor C3. In addition, the electronic device 440 (in FIG. 4) may include a plurality of data lines (DA, DA1, and DA2) and a plurality of scan lines (SN, SN1, and SN2) that may be respectively electrically coupled to the transistor 414 of the sub-pixel 400, the transistor 416 of the sub-pixel 402, and the transistor 418 of the sub-pixel 404. The manner of connecting the elements in sub-pixel 400, sub-pixel 402, and sub-pixel 404 is similar to that in FIG. 1, and thus will not be described again.

It should be noted that the transistor 408 in the sub-pixel 400, the transistor 410 in the sub-pixel 402, and the transistor 412 in the sub-pixel 404 shown in FIG. 4 can be tested, for example, by sharing one test element 406. For example, in some embodiments (as shown in FIG. 4), a control switch 426 can be electrically connected, for example, between the test element 406 and the transistor 408. The connection relationship (e.g. electrical connection or electrical insulation) between the test element 406 and the transistor 408 can be controlled by the control switch 426. Similarly, a control switch 428 can be electrically connected, for example, between the test element 406 and the transistor 410. The connection relationship (e.g. electrical connection or electrical insulation) between the test element 406 and the transistor 410 can be controlled by the control switch 428. Similarly, a control switch 430 can be electrically connected, for example, between the test element 406 and the transistor 412. The connection relationship (e.g. electrical connection or electrical insulation) between the test element 406 and the transistor 412 can be controlled by the control switch 430. In some embodiments (as shown in FIG. 4), the other end of the test element 406 can be electrically connected to a ground voltage 432 (or the negative voltage Vss or a positive voltage lower than the positive voltage Vdd).

In addition, as shown in FIG. 4, when the transistor 408 in the sub-pixel 400 is to be tested for defects, the test element 406 can be electrically connected to the transistor 408 by turning on the control switch 426, but the control switch 428 and the control switch 430 are turned off to electrically insulate the test element 406 from the transistor 410 and the transistor 412. Similarly, after the transistor 408 to be tested is electrically connected to the test element 406, the test method for testing whether the transistor is defective may refer to the test method described above, and therefore will not be described again.

As described above, when the transistor 408 is defective, the leakage current I2 may flow to the test element 406 during the test to cause the test element 406 to generate thermal energy. Similarly, if the transistors (e.g. the transistor 410 or the transistor 412) in the other sub-pixels (e.g. the sub-pixel 402 or the sub-pixel 404) are to be tested for defects, the test element 406 is electrically connected to the transistor to be tested by turning on the corresponding control switch (for example, the control switch 428 or the control switch 430), and the other control switches connected to the test element 406 are turned off, so that the test element 406 is electrically insulated from the transistor that is not to be tested. The method for testing defects is described above, so it will not be described again.

In some embodiments (not shown), the other transistors (the transistors 414, 416, and 418) of the sub-pixel 400, the sub-pixel 402, and the sub-pixel 404 may also be tested, for example, by sharing a test element. That is, a control switch for controlling can be separately disposed between the transistors 414, 416 and 418 and the test element.

Figure 5:
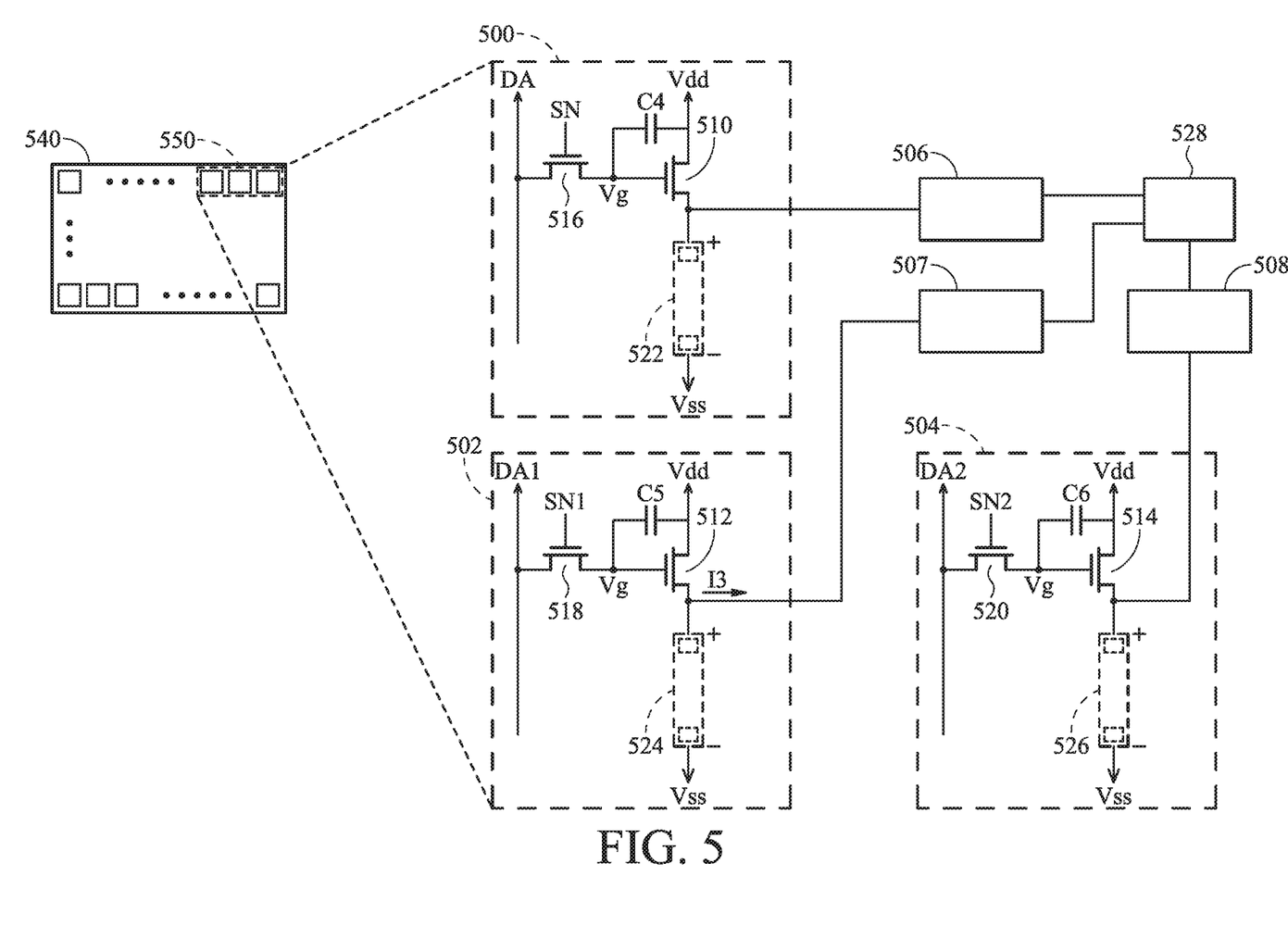
FIG. 5 is a schematic diagram of the electronic device in accordance with some embodiments of the disclosure.

FIG. 5 is a schematic diagram of the electronic device in accordance with some embodiments of the disclosure. The display area of an electronic device 540 includes a plurality of pixels, wherein one pixel 550 may include a sub-pixel 500, a sub-pixel 502, and a sub-pixel 504. The sub-pixel 500 may include a transistor 510, an electronic unit 522, a transistor 516, and a capacitor C4. The sub-pixel 502 may include a transistor 512, an electronic unit 524, a transistor 518, and a capacitor C5. The sub-pixel 504 may include a transistor 514, an electronic unit 526, a transistor 520, and a capacitor C6. The manner of connecting the elements in sub-pixel 500, sub-pixel 502, and sub-pixel 504 of FIG. 5 is similar to that for sub-pixel 400, sub-pixel 402, and sub-pixel 404 of FIG. 4, and thus will not be described again. Compared with FIG. 4, the main difference of FIG. 5 is that the transistors (510, 512, and 514) in sub-pixel 500, sub-pixel 502, and sub-pixel 504 are electrically connected to different test elements (506, 507 and 508), which may be connected to a ground voltage 528, for example, but they are not limited thereto.

As shown in FIG. 5, when the transistor 512 in the sub-pixel 502 is to be tested for defects, the transistor 512 may be turned off. If the transistor 512 is defective, the transistor 512 cannot be normally turned off (e.g. short-circuited), so that the leakage current I3 flows to the test element 507 to generate thermal energy. Similarly, the test manner to test the transistor 510 of the sub-pixel 500, or the transistor 514 of the sub-pixel 504 is similar to that to test the transistor 512, and thus will not be described again.

In some embodiments, the impedance ratio of the test element 506 to the electronic unit 522, the impedance ratio of the test element 507 to the electronic unit 524, and/or the impedance ratio of the test element 508 to the electronic unit 526 may be between 10 and $10^7$ ($10 \leq$ impedance ratio $\leq 10^7$), but it is not limited thereto. If it is confirmed in the above manner that the element (for example, a transistor) in the sub-pixel has no defects, the electronic unit of the corresponding sub-pixel, for example, may be subsequently disposed in the sub-pixel. In addition, when the electronic unit is turned on, through the design of the impedance ratio between the test element and the electronic unit described above, most of the current may flow to the electronic unit, and only a small current may flow to the corresponding test element in accordance with a voltage divider rule, thereby reducing the influence of the test element on operation of the electronic unit. In addition, if a control switch is electrically connected to both the transistor (such as a driving transistor) and the test element, when the electronic unit needs to be turned on, the control switch can be turned off to reduce possibility of current flowing to the test element.

Figure 6:
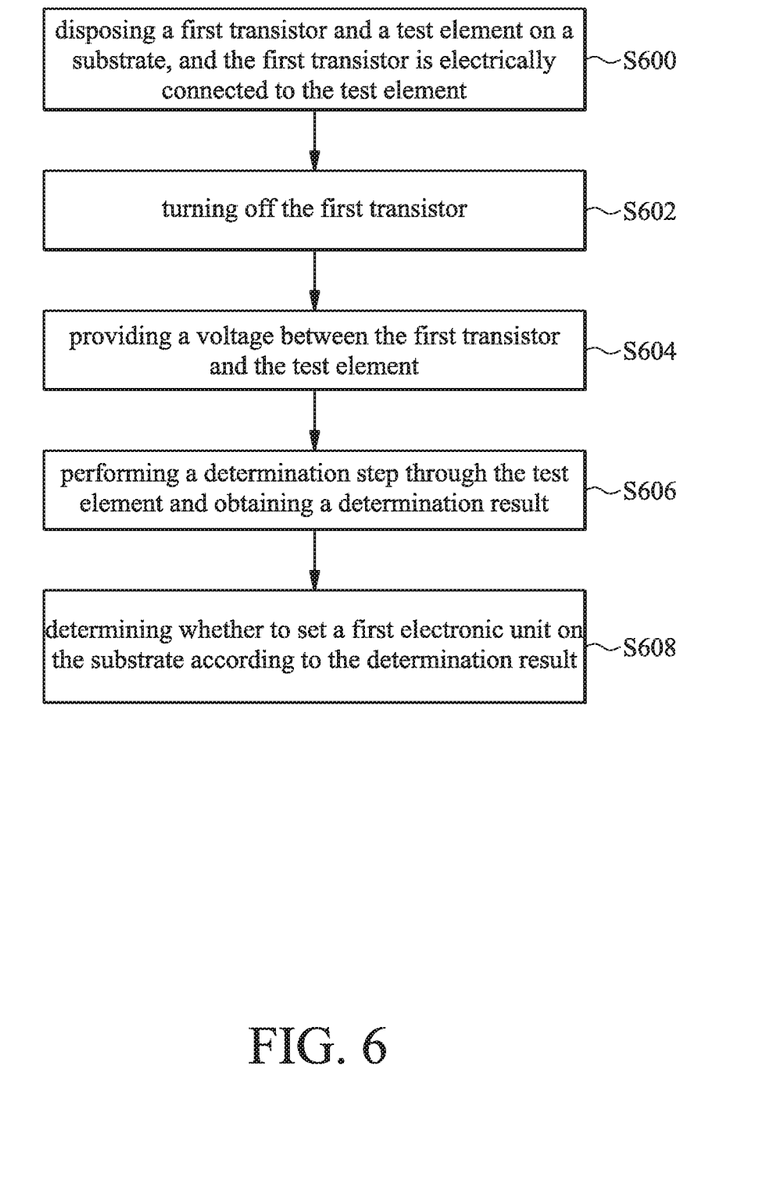
FIG. 6 is a schematic diagram of a manufacturing process of the electronic device in accordance with some embodiments of the disclosure.

FIG. 6 is a schematic diagram of a manufacturing process of the electronic device in accordance with some embodiments of the disclosure. As shown in FIG. 6, in step S600, a first transistor (for example, the transistor 106 in FIG. 1 or the transistor 106 in FIG. 3) and a test element (for example, the test element 104 in FIG. 1 or the test element 104 in FIG. 3) are deposited on a substrate (e.g. an array substrate), and the first transistor is electrically connected to the test element. In some embodiments, a control switch (for example, the control switch 300 in FIG. 3) is further disposed on the substrate, and the control switch (e.g. the control switch 300) is electrically connected to both the first transistor (e.g. the transistor 106 in FIG. 3) and the test element (e.g. the test element 104 in FIG. 3). The control switch is turned on, so that the first transistor is electrically connected to the test element. The process involves, in step S602, turning off the first transistor (e.g. the transistor 106). In some embodiments (as shown in FIG. 1), step S604 may be performed after step S602. In step S604, for example, voltage is applied (e.g. the voltage=the positive voltage Vdd—the negative voltage Vss) between the first transistor and the test element, but it is not limited thereto. In some embodiments (as shown in FIG. 4), voltage is applied (the voltage=the positive voltage Vdd—the ground voltage) between the first transistor and the test element.

Then, the process involves, in step S606, performing a determination step through the test element and obtaining a determination result. The determination step is used, for example, to determine whether the first transistor is defective or not. In some embodiments, the determination step may include, for example, using a temperature detector (for example, the temperature detector 112 in FIG. 1) to measure whether the test element has an abnormal temperature rise. The abnormal temperature can be referred to the above description. In step S608, the process involves determining whether to set a first electronic unit (for example, the electronic unit 108 in FIG. 1 or in FIG. 3) on the substrate according to the determination result. For example, when the test element has an abnormal temperature rise, the determination result is, for example, that the first transistor is defective. In addition, when the first transistor is defective, it may be selected to be ignored or repaired according to the condition of the defect of the first transistor. When the test element does not have an abnormal temperature rise, it is determined that the first transistor has no defects, and then a first electronic unit can be disposed, and the first electronic unit is electrically connected to the first transistor (for example, the transistor 106 in FIG. 1 or FIG. 3).

Figure 7:
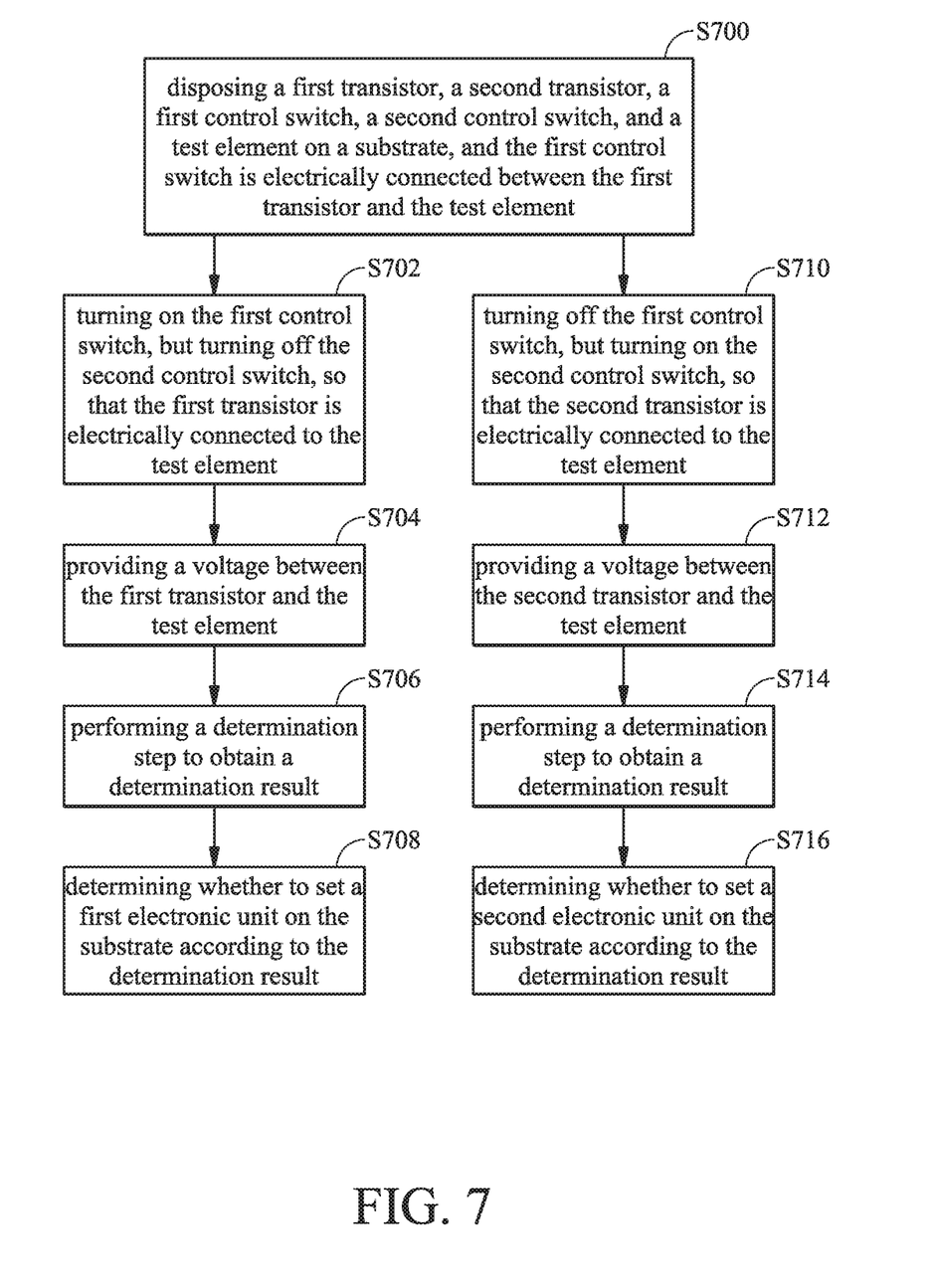
FIG. 7 is a schematic diagram of the manufacturing process of the electronic device in accordance with some embodiments of the disclosure.

FIG. 7 is a schematic diagram of the manufacturing process of the electronic device in accordance with some embodiments (as shown in FIG. 4) of the disclosure. As shown in FIG. 7, in step S700, a first transistor (e.g. the transistor 408), a second transistor (e.g. the transistor 410), a first control switch (e.g. the control switch 426), a second control switch (e.g. the control switch 428), and a test element (e.g. the test element 406) are deposited on a substrate. The first control switch (e.g. the control switch 426) is electrically connected to both the first transistor (e.g. the transistor 408) and the test element (e.g. the test element 406), and the second control switch (e.g. the control switch 428) is electrically connected to both the second transistor (e.g. the transistor 410) and the test element (e.g. the test element 406). After the step S700, step S702 and/or step S710 may be selectively performed, but it should be noted that step S702 and step S710 need to be performed separately. After the step S700, for example, the step S702 could be performed. The process involves, in step S702, turning on the first control switch (e.g. the control switch 426), but turning off the second control switch (e.g. the control switch 428), so that the first transistor (e.g. the transistor 408) is electrically connected to the test element (e.g. the test element 406). In step S704, a voltage is applied (for example, the voltage=the positive voltage Vdd—the negative voltage Vss, or the voltage=the positive voltage Vdd—the ground voltage) between the first transistor and the test element, but it is not limited thereto. Subsequently, in step S706, a determination step is performed to obtain a determination result. The determination step is used, for example, to determine whether the first transistor is defective or not. As mentioned above, the determination step may include, for example, using a temperature detector to measure whether the test element has an abnormal temperature rise. Then, in step S708, the process involves determining whether to set a first electronic unit (e.g. the electronic unit 420 in FIG. 4) on the substrate according to the determination result. In some embodiments, when the test element has an abnormal temperature rise, it is determined that the first transistor is defective, and it may be selected to be ignored or repaired according to the condition of the defect of the first transistor. When the test element does not have an abnormal temperature rise, it is determined that the first transistor has no defects, and then the first electronic unit can be disposed, and the first electronic unit is electrically connected to the first transistor (e.g. the transistor 408).

Similarly, step S710 may also be performed, for example, after step S700. In step S710, the process involves turning off the first control switch (e.g. the control switch 426), but turning on the second control switch (e.g. the control switch 428), so that the second transistor (e.g. the transistor 410) is electrically connected to the test element (e.g. the test element 406). In step S712, voltage is applied (for example, the voltage=the positive voltage Vdd—the negative voltage Vss, or the voltage=the positive voltage Vdd—the ground voltage) between the second transistor and the test element, but it is not limited thereto. Subsequently, in step S714, a determination step is performed to obtain a determination result. The determination step is described above. Then, in step S716, the process involves determining whether to set a second electronic unit (e.g. the electronic unit 422 in FIG. 4) on the substrate according to the determination result. In some embodiments, when the test element has an abnormal temperature rise, it is determined that the second transistor is defective, and it may be selected to be ignored or repaired according to the condition of the defect of the second transistor. When the test element does not have an abnormal temperature rise, it is determined that the second transistor has no defects, and then the second electronic unit can be disposed, and the second electronic unit is electrically connected to the second transistor (e.g. the transistor 410).

The test method of the present disclosure can be applied to a circuit test in a panel or a test of a circuit board of a backlight module.

The circuit architecture and the manner of connection between the elements in the disclosure are merely examples, and the disclosure is not limited thereto. The features of the various embodiments can be arbitrarily mixed and used as long as they do not contradict the spirit of the invention or conflict. The architectural design or material selection of the test element is merely an example, and the disclosure is not limited thereto.

The ordinals in the specification and the claims of the present disclosure, such as "first", "second", "third", etc., has no sequential relationship, and is just for distinguishing between two different devices with the same name. In the specification of the present disclosure, the word "couple" refers to any kind of direct or indirect electronic connection. The present disclosure is disclosed in the preferred embodiments as described above, however, the breadth and scope of the present disclosure should not be limited by any of the embodiments described above. Persons skilled in the art can make small changes and retouches without departing from the spirit and scope of the disclosure. The scope of the disclosure should be defined in accordance with the following claims and their equivalents.

What is claimed is:

1. A manufacturing process of an electronic device, comprising:
    disposing a first transistor, a control switch and a test element on a substrate, wherein the control switch electrically connects between the first transistor and the test element;
    turning off the first transistor;
    turning on the control switch;
    providing a voltage between the first transistor and the test element;
    performing a determination step through the test element and obtaining a determination result; and
    determining to set a first electronic unit comprising an LED on the substrate after the determination result is that the first transistor is not defective.

2. The manufacturing process as claimed in claim 1, wherein the test element has a first impedance, the first electronic unit has a second impedance, and the first impedance is greater than the second impedance.

3. The manufacturing process as claimed in claim 2, wherein the ratio of the first impedance to the second impedance is between 10 and $10^7$.

4. The manufacturing process as claimed in claim 1, wherein the test element is adjacent to the first transistor and to at least partially overlap the first sub-pixel in a top view of the electronic device.

5. The manufacturing process as claimed in claim 1, wherein the test element is in parallel to the first electronic unit.

6. The manufacturing process as claimed in claim 1, wherein the test element comprises a resistor, a pseudo thin film transistor, or a high-impedance trace line.

7. The manufacturing process as claimed in claim 1, wherein the control switch comprises a transistor.

8. The manufacturing process as claimed in claim 1, further comprising:
    disposing a second transistor and a second control switch on the substrate; wherein the second transistor is electrically connected to the test element, and the second control switch is electrically connected to the second transistor and the test element;
    turning on the control switch and turning off the second control switch, and the first transistor is electrically connected to the test element;
    providing a voltage between the first transistor and the test element;
    performing a second determination step through the test element and obtaining a second determination result; and
    determining whether to set the first electronic unit on the substrate according to the second determination result.

9. The manufacturing process as claimed in claim 8, further comprising:
    turning off the control switch and turning on the second control switch, and the second transistor is electrically connected to the test element;
    providing a voltage between the second transistor and the test element;
    performing a third determination step through the test element and obtaining a third determination result; and
    determining whether to set a second electronic unit on the substrate according to the third determination result.

10. The manufacturing process as claimed in claim 1, further electrically connecting one end of the test element connected to the first transistor, and electrically connecting the other end of the test element connected to a negative voltage or a ground voltage.

* * * * *